United States Patent
Floyd et al.

(10) Patent No.: US 7,197,419 B2
(45) Date of Patent: Mar. 27, 2007

(54) SYSTEM AND METHOD FOR THERMAL MONITORING OF IC USING SAMPLING PERIODS OF INVARIANT DURATION

(75) Inventors: Michael Stephen Floyd, Austin, TX (US); Asher Shlomo Lazarus, Austin, TX (US); Brian Chan Monwai, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 11/050,324

(22) Filed: Feb. 3, 2005

(65) Prior Publication Data

US 2006/0173645 A1    Aug. 3, 2006

(51) Int. Cl.
*G06F 17/40* (2006.01)

(52) U.S. Cl. .................. 702/130; 702/132; 713/322; 713/501; 374/100; 323/907

(58) Field of Classification Search ............... 702/130, 702/132; 713/322, 501; 327/512, 63; 323/907; 374/100
See application file for complete search history.

(56) References Cited

U.S. PATENT DOCUMENTS

| | | | | |
|---|---|---|---|---|
| 5,039,878 A | * | 8/1991 | Armstrong et al. | 327/512 |
| 5,359,234 A | * | 10/1994 | Atriss et al. | 327/513 |
| 5,440,520 A | * | 8/1995 | Schutz et al. | 365/226 |
| 5,502,838 A | * | 3/1996 | Kikinis | 713/501 |
| 5,535,370 A | | 7/1996 | Raman et al. | |
| 5,568,493 A | | 10/1996 | Morris | |
| 5,832,284 A | * | 11/1998 | Michail et al. | 713/322 |

OTHER PUBLICATIONS

U.S. Appl. No. 10/366,437, filed Feb. 13, 2003, Clabes et al., Thermally Aware Integrated Circuit.

* cited by examiner

*Primary Examiner*—John Barlow
*Assistant Examiner*—Hien Vo
(74) *Attorney, Agent, or Firm*—Duke W. Yee; Thomas E. Tyson; James O. Skarsten

(57) ABSTRACT

A system and method are provided for monitoring temperature within a specified integrated circuit. Usefully, the system comprises at least one oscillator device proximate to the integrated circuit for generating signal pulses at a frequency that varies as a function of the temperature adjacent to the oscillator device. The system further comprises a control unit for establishing sample acquisition periods of invariant time duration based on an time invariant reference clock. A sampling component is coupled to count the number of pulses generated by the oscillator device during each of a succession of the time invariant sample acquisition periods, and a threshold component responsive to the respective count values for the succession of sample acquisition periods provides notice when at least some of the count values have a value associated with a prespecified excessive temperature level.

22 Claims, 3 Drawing Sheets

SYSTEM AND METHOD FOR THERMAL MONITORING OF IC USING SAMPLING PERIODS OF INVARIANT DURATION

BACKGROUND OF THE INVENTION

1. Technical Field

The invention disclosed and claimed herein generally pertains to a system and method for monitoring thermal conditions in a processor chip or other integrated circuit (IC), in order to detect unacceptable temperature levels. More particularly, the invention pertains to a system of the above type wherein thermal sensors placed in a chip or IC each includes an oscillator for generating signal pulses at a frequency that varies as a function of the adjacent temperature. Even more particularly, the invention pertains to a system of the above type wherein the oscillator pulses are counted during sample acquisition periods of fixed or unvarying time duration.

2. Description of Related Art

Previously, thermal sensors for use in processors or other integrated circuits, such as IBM power processors, have used the functional clock of the processor to sample an asynchronous thermally sensitive device such as a ring oscillator (PSRO). More particularly, it was realized that the frequency produced by a PSRO varies as a function of the adjacent or proximate temperature. Thus, by sampling the oscillation frequency during successive time intervals, the adjacent temperature may be measured. However, it is clear that the above prior art method makes the temperature measurement dependent on the processor frequency, since the measurement is a function of the time intervals used to sample the PSRO oscillations. As indicated above, these time intervals are determined by the processor clock frequency.

Processors containing sensors of the type described above for thermal monitoring may be used in systems where the processor clock frequency, or reference frequency, requires spread spectrum, or constant dynamic frequency variation. Spread spectrum may be used in order to reduce electromagnetic interference (EMI). In this technique the reference frequency used to determine the thermal sampling intervals could, for example, nominally be 3.0 GHz. However, with spread spectrum the reference frequency is in fact deliberately varied, such as between 2.99 GHz and 3.01 GHz, in order to avoid excessive noise generation. Moreover, frequency slewing could be applied to the reference frequency, that is, temporary reduction of frequency to reduce power.

It has been found that the above variations in processor reference frequency can introduce significant error into the measurement of temperature. This is because apparent variations in temperature reading, that are in fact due to deliberate changes in reference frequency, are indistinguishable from the actual variations in temperature that are intended to be monitored. Thus, a user of the above prior art approach for temperature sensing could not be sure that the true temperature was being determined. This uncertainty has made it necessary to heavily guardband the "acceptable" temperature range of the hardware or software that is relying on the temperature sensor readings for its proper operation.

SUMMARY OF THE INVENTION

To overcome disadvantages of the prior art, including those referred to above, the invention provides an external clock source that is time invariant. This external source may be brought into the chip or IC that is being monitored, or may comprise a source already existing or available therein. This source is used to increment a counter which controls the duration of time in which the temperature sensitive device on the chip or IC is sampled. In one useful embodiment, a system is provided for monitoring temperature within a specified integrated circuit. The system comprises at least one oscillator device proximate to the integrated circuit for generating signal pulses at a frequency that varies as a function of the temperature proximate or adjacent to the oscillator device. The system further comprises a control unit for establishing sample acquisition periods of predetermined invariant time duration based on the time invariant reference clock. A sampling component is coupled to count the number of pulses generated by the oscillator device during each of a succession of the time invariant sample acquisition periods, and a threshold component responsive to the respective count values for the succession of sample acquisition periods provides notice when at least some of the count values have a value associated with a prespecified excessive temperature level.

BRIEF DESCRIPTION OF THE DRAWINGS

The novel features believed characteristic of the invention are set forth in the appended claims. The invention itself, however, as well as a preferred mode of use and further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
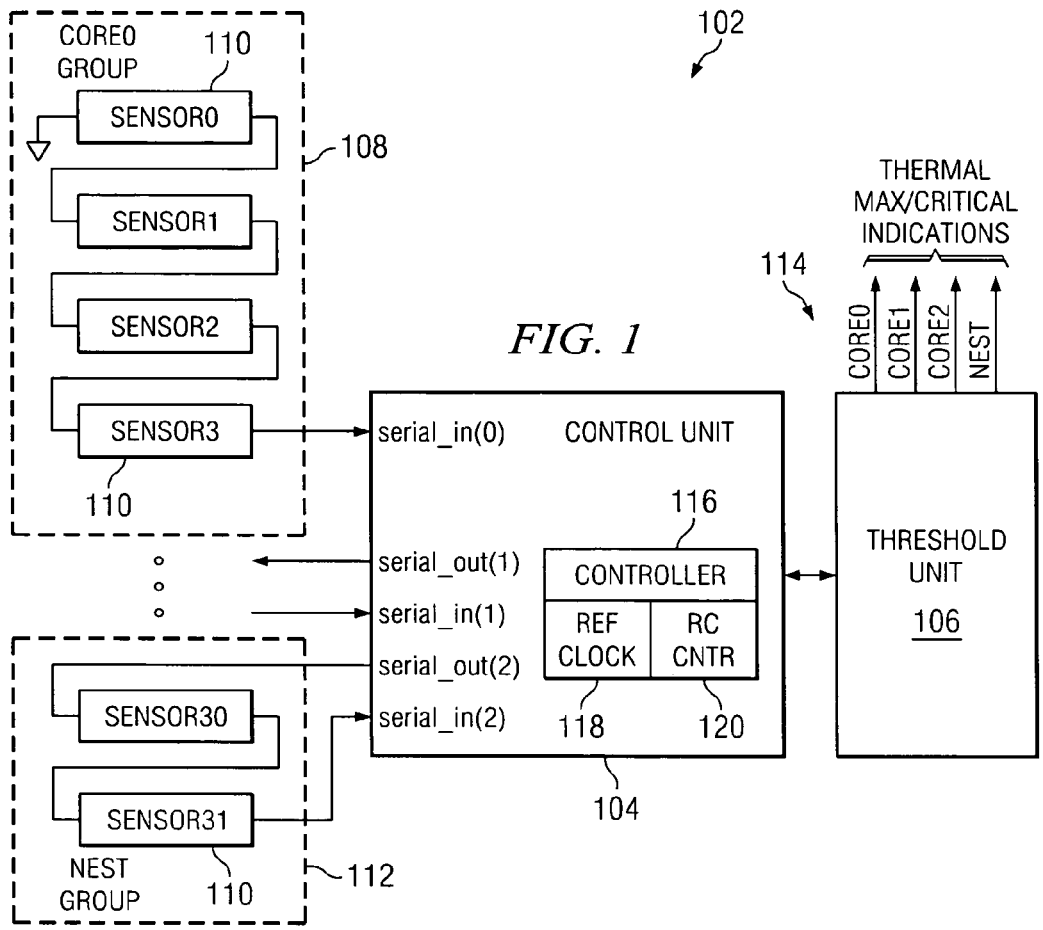
FIG. 1 is a block diagram showing an embodiment of the invention.

Referring to FIG. 1, there is shown a thermal monitor system 102 comprising an embodiment of the invention. System 102 is provided with a control unit 104 and a threshold unit 106, and is further provided with a number of sensor blocks or thermal sensors 110. FIG. 1 indicates that the embodiment shown thereby may include up to 32 sensors blocks 110, respectively referenced as sensor 0-sensor 31. In a useful arrangement, the sensor blocks are ordered in groups of four, such as group 108 and partial group 112.

By providing multiple sensor blocks 110, the sensor blocks may be distributed throughout a chip or IC and placed at regions of high power density. As described hereinafter in further detail, each sensor includes a temperature-sensitive ring oscillator (TSRO) having an output frequency that varies inversely with its temperature. Each thermal sensor 110 is further provided with an incrementer, for counting successive pulses of the oscillator output signal, and with a shifter for sending respective count values to the control macro 114, comprising control unit 104 and the threshold unit 106, collectively. FIG. 1 shows that respective thermal sensors 110 are linked together serially, along a single serial data path. This path carries all count values to control unit 104 and threshold unit 106.

Control unit 104 is provided with a controller 116 for sending "run" and "sample" signals to operate respective thermal sensors 110, during respective data sampling cycles, as described hereinafter. Control unit 104 further comprises a device (not shown) for deserializing incoming data received from the thermal sensors. As likewise described hereinafter, the threshold unit 106 is provided with logic, for comparing the data sent to control macro 114 from the sensors 110 with reference values indicating acceptable temperature levels. More specifically, the received count values are compared with stored threshold values associated with both warning and crictical temperature values. The threshold unit is thus able to provide notice if the received data indicates that a temperature threshold has been crossed.

Referring further to FIG. 1, there are shown some of the sensor groups, such as group 108, referred to as a core group. Group 112, however, is referred to as a nest group. In some chips with which system 102 may be used, core sensors would be placed adjacent to regions of the chip that perform processing tasks.

Figure 2:
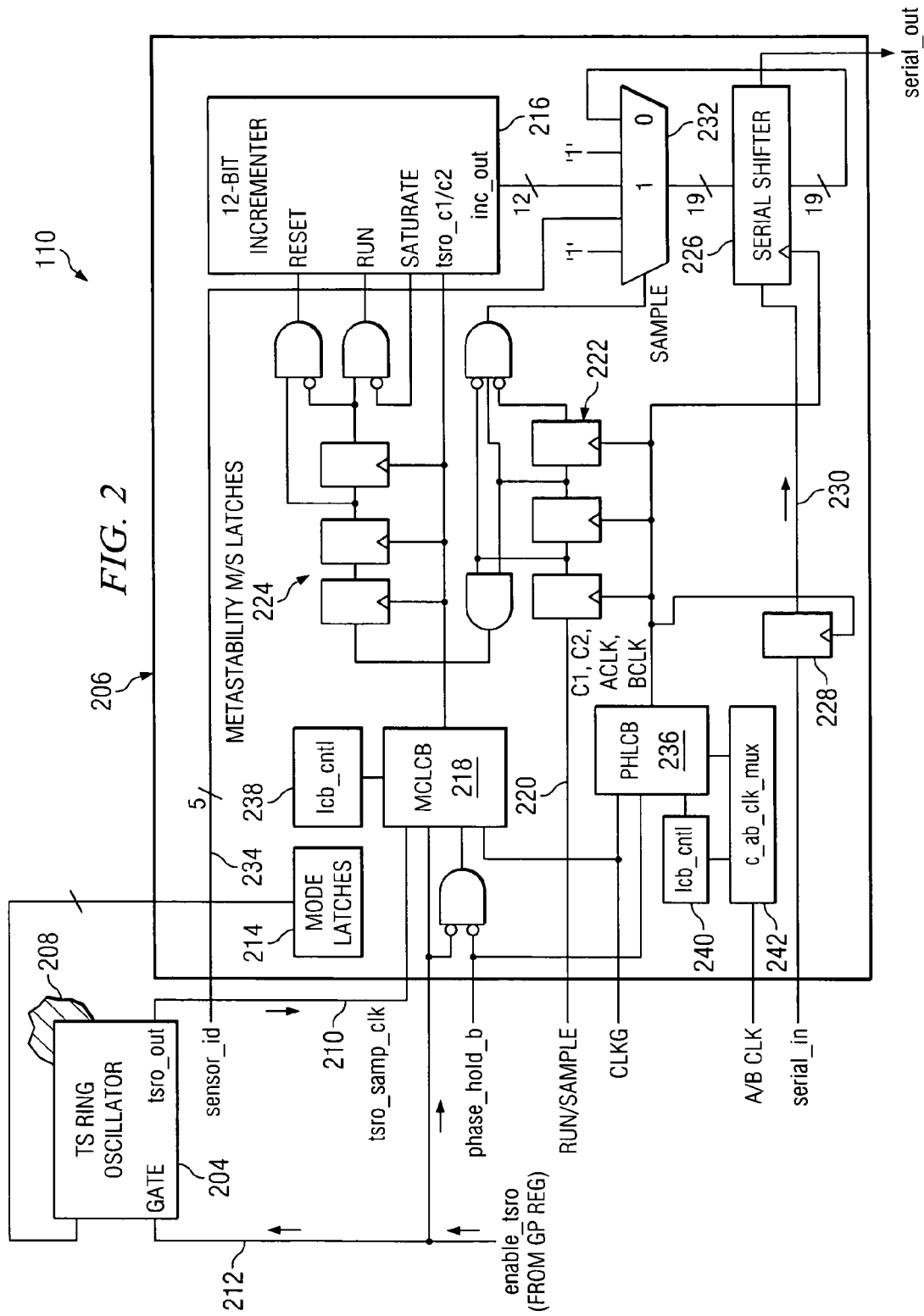
FIG. 2 is a circuit diagram showing a thermal sensor for the embodiment of FIG. 1.

Referring to FIG. 2, there is shown a thermal sensor block 110 comprising a thermal sensor ring oscillator (TSRO) 204, which is an analog device, operatively connected to a configuration of digital components 206. Ring oscillator 204 is shown adjacent to a representative region 208 of a processor chip or other IC in which the thermal sensors 110 of system 102 have been placed or embedded. Thus, ring oscillator 204 will have the same temperature as region 208, and its temperature will vary as the region temperature varies. As stated above, oscillator 204 is configured to generate an output signal having a frequency that varies inversely with the temperature of oscillator 204. Thus, the output frequency of oscillator 204 will always indicate the temperature of the adjacent IC region 208.

FIG. 2 shows the frequency signal generated by oscillator 204 coupled out from a terminal tsro_out, over a path 210. Ring oscillator 204 is enabled by an enabling signal after power to the IC associated with region 208 has stabilized. The enabling level, delivered over path 212, is provided by a general purpose register (not shown). Mode latches 214 are also provided for operation of the ring oscillator 204.

Usefully, the oscillator 204 is configured to run at a nominal frequency of 1.5 GHz (at 85 degrees C.) and to exhibit a 6% change in period for every 10-degree temperature change. The maximum operating frequency is on the order of 2.4 GHz. For these values, the relationship between temperature and oscillator output frequency would be as follows:

TABLE 1

| Temp (° C.) | TSRO freq (Ghz) |
|---|---|
| 145 | 1.03 |
| 135 | 1.10 |
| 125 | 1.17 |
| 115 | 1.25 |
| 105 | 1.33 |
| 95 | 1.41 |
| 85 | 1.50 |
| 75 | 1.59 |
| 65 | 1.69 |
| 55 | 1.79 |

TABLE 1-continued

| Temp (° C.) | TSRO freq (Ghz) |
|---|---|
| 45 | 1.89 |
| 35 | 2.01 |
| 25 | 2.13 |

Referring further to FIG. 2, there is shown digital configuration 206 provided with a 12-bit incrementer, or incremental counter, 216. The 12-bit incrementer is clocked during normal operation by the TSRO domain. FIG. 2 shows the output of oscillator 204 coupled to incrementer 216 through a clock buffer 218. When control unit 104 produces a run signal, as described hereinafter, the rising edge of the run signal resets incremental counter 216. During the run signal, the counter 216 is incremented by each successive pulse of the output signal provided by oscillator 204. Thus, the run signal defines a sample acquisition period. At the end of the run signal, the final count value temporarily remains held in incremental counter 216. It will be readily apparent that by using this count value and the time duration of the run signal, the frequency of oscillator 204, and thus its corresponding temperature may be readily determined. FIG. 2 shows the run signal coupled to incrementer 216 over a path 220, through a set of latches 222 and also a set of latches 224.

FIG. 2 further shows digital component 206 provided with a serial shift register 226, which usefully comprises a 19-bit shifter. Shifter 226 resides in the clkg domain, and continually shifts data along the serial path 230, from serial_in, through a staging latch 228 to serial_out. The clkg signal is the master clock signal of the processor or other IC that is being monitored by the thermal sensors 110 of system 102.

Figure 3:
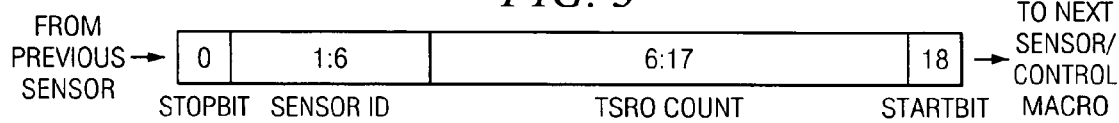
FIG. 3 is a schematic diagram showing a data packet to be sent from a thermal sensor to the control unit in the embodiment of FIG. 1.

Following the run signal described above, the control unit 104 sends a sample shift pulse to each sensor 110, which is coupled to a buffer 232. Thereupon, the 12-bit count value from incrementer 216 is loaded in parallel into shifter 226, preferably as bits 6–17. Bits 1–5 are set to the ID pins 234 of the particular sensor 110, to provide the sensor identification for the loaded count value. Bits 0 and 18 of shifter 226 are set to logic "1", to frame the data packet with stop and start bits, respectively. The format of the complete data packet loaded into shifter 226, including the sampled TSRO count value, is shown in FIG. 3. Subsequent clkg pulses move the packet along the serial data path, to the macro control 114.

FIG. 2 shows the latches in the clkg domain controlled by "phlcb" type clock buffers 236. Through the use of the phase-hold, thermal sensors in the processor core are run at the slower nest frequency such that all thermal sensors on the IC are sampled using the same clock rate. The latches in the TRSO domain are controlled by "mclcb" type clock buffers 218, which multiplex two asynchronous clocks down to a single c1/c2 pair. FIG. 2 further shows local clock buffers 238 and 240, a multiplexer 242, and an a/b clock signal that may be used to scan test the latches. This is done to ensure that all the latches of digital component 206 are in good working condition.

Referring again to FIG. 1, there is shown controller 116 of control unit 104 provided with a reference clock 118 and with a reference clock counter 120. In accordance with the invention, the reference clock 118 provides a clock signal of fixed, unvarying frequency, so that the time periods between successive clock pulses thereof does not change. In one useful example, reference clock 118 provides a 32 MHz timebase pulse signal used to provide the system with a Real-time clock.

Figure 4:
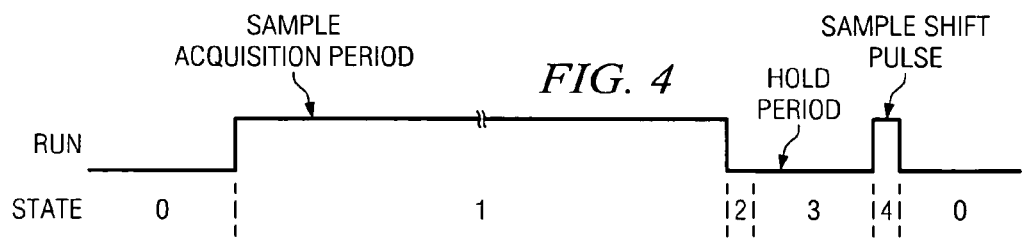
FIG. 4 is a timing diagram illustrating a data sampling cycle provided by the control unit of the embodiment of FIG. 1.

Controller 116 of control unit 104 is configured to provide successive data sampling cycles for respective thermal sensors 110, each cycle having four states as shown in FIG. 4. In state 0 a run signal is logic "0". At the beginning of state 1, the run signal is asserted, whereupon counter 120 commences counting a prespecified number of reference clock pulses. This is done to clearly define a TSRO signal count period or sampling acquisition period. In state 2, the run signal is deasserted, and controller 116 moves to state 3, the hold state. The time period of the hold state is sufficiently long to ensure that the incrementers 216 of all the respective sensors 110 have become inactive, before data is retrieved therefrom.

State 4 lasts for only a single hnest clock cycle output of lcb block 236 of FIG. 2. The run signal is asserted for this single cycle, to provide a sample shift pulse that causes all the thermal sensors 110 to transfer their data to their respective registers 226. After state 4, the controller 116 returns to state 0.

The time or duration for the sample acquisition period is usefully selected by considering the operation which will be required by an incrementer 216 for a specified range of temperatures. For example, it could be desired to limit the count value required in operating an incrementer 216 to count 1000, for a temperature of 25 degrees C. Oscillator 204 has a frequency of 2.13 GHz at this temperature. At an oscillator frequency of 2.13 GHz, it would take 470 nanoseconds for incrementer 216 to count 1000 oscillator pulses. More generally, Table 2 below shows the respective TRSO count values that would be registered during a 470 nanosecond count period, for TRSO temperatures at 10 degree intervals between 25 degrees C. and 140 degrees C.

TABLE 2

| Temp (° C.) | TSRO freq (Ghz) | Count |
|---|---|---|
| 145 | 1.03 | 486 |
| 135 | 1.10 | 517 |
| 125 | 1.17 | 550 |
| 115 | 1.25 | 586 |
| 105 | 1.33 | 623 |
| 95 | 1.41 | 663 |
| 85 | 1.50 | 705 |
| 75 | 1.59 | 747 |
| 65 | 1.69 | 792 |
| 55 | 1.79 | 840 |
| 45 | 1.89 | 890 |
| 35 | 2.01 | 943 |
| 25 | 2.13 | 1000 |

Moreover, a 32 MHz clock would generate 15 pulses during a 470 nanosecond period. Thus, to time a sample acquisition period of precisely 470 nanoseconds controller 116 could be configured to end such period, and to move to state 2, when clock reference counter 120 registers 15 counts. The count value provided by incrementer 216 during such sample acquisition period would be as shown by Table 2, for the corresponding TSRO temperature.

Figure 5:
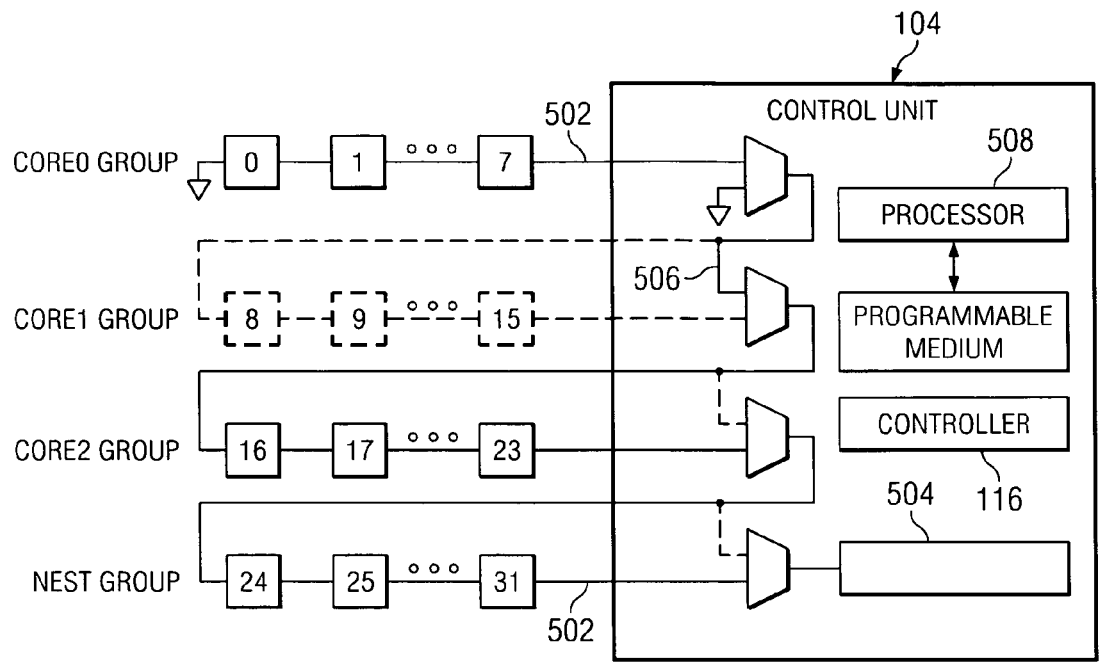
FIG. 5 is a schematic diagram illustrating a serial data path to the control unit of the embodiment of FIG. 1.

Referring to FIG. 5, there is shown each of the sensor blocks 110 coupled along a single serial data path 502. The count values provided by the serial shifters 226 of respective sensors are thus moved sequentially along path 502 to the control unit 104. Conceptually, the input of sensor 0 is tied to ground, while the output of the last sensor along the path 502 is connected to the control unit 104. Usefully, the control unit is provided with a 19-bit wide shift register 504. Respective data packets containing count values are parallel loaded thereinto, as they arrive at control unit 104.

In a useful alternative arrangement, the thermal sensors 110 are arranged in a number of groups, such as four groups. In this arrangement, the output of each group is connected to the control unit 104, before going to the input of the next following group along path 502. Thus, the output of sensor group 0 is connected to the control unit before going to the input of sensor group 1. This enables the control unit to multiplex around a sensor group that has become disabled. As an example, FIG. 5 shows the control macro providing a path 506 around the core 1 group.

FIG. 5 further shows control unit 104 provided with a processor 508 and a programmable, computer readable medium 510, in addition to controller 116 and register 504. Programmable medium 510 contains instructions to be read by processor 508, whereupon processor 508 directs control unit 104 and other components of system 102 to operate as described above.

Figure 6:
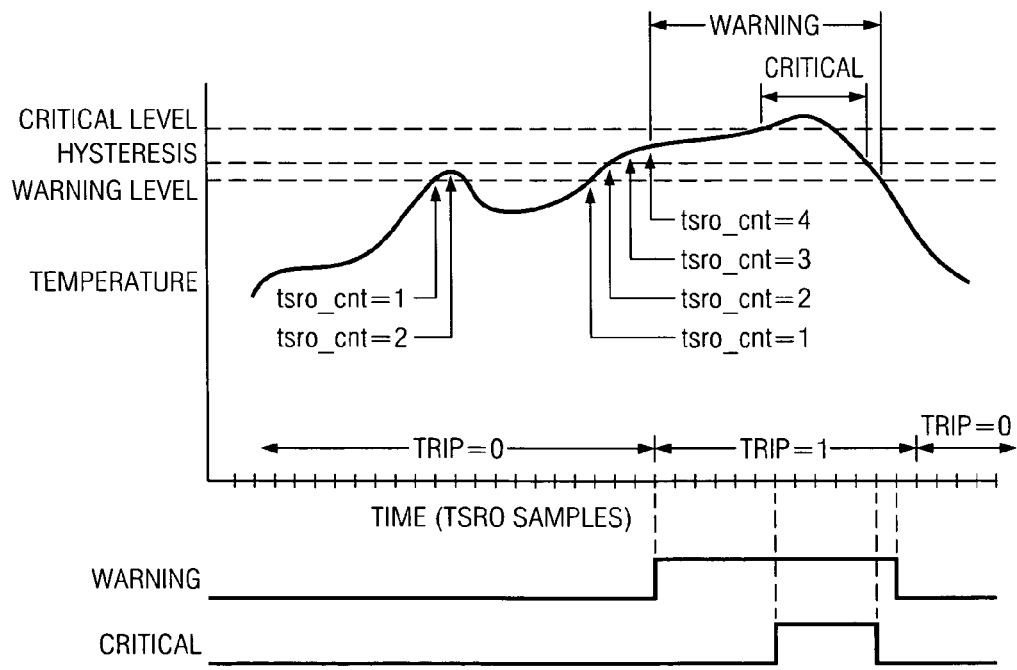
FIG. 6 is a graphical diagram illustrating operation of a threshold unit of the embodiment of FIG. 1.

When incoming count value data is coupled to threshold unit 106, logic therein looks at the incoming data to determine the associated sensor identification. If the temperature value indicated by the incoming count value is above an established warning level, a counter (not shown) for the identified sensor is incremented. A trip event occurs once this counter has reached a maximum trip count level. The trip type is "warning" if the temperature is above the warning level. The trip type is "critical" if the temperature is above the critical level for the sensor. For a warning to be deasserted, the temperature must drop below the warning level. For the critical level to be deasserted, the temperature must drop below the hysteresis level. Warning and critical levels are illustrated in FIG. 6.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A system for monitoring temperature within a specified integrated circuit, said system comprising:
    at least one oscillator device proximate to said integrated circuit for generating signal pulses at a frequency that varies as a function of the temperature adjacent to said oscillator device;
    a control unit for establishing sample acquisition periods of predetermined invariant time duration;
    a sampling component coupled to count the number of pulses generated by said oscillator device during each of a succession of said time invariant sample acquisition periods; and
    a threshold component responsive to the respective count values for said succession of sample acquisition periods to provide notice when at least some of said count values have a value associated with a prespecified excessive temperature level.

2. A system of claim 1, wherein:
    said control unit uses a time invariant reference clock to establish the time duration for each of said sample acquisition periods.

3. The system of claim 2, wherein:
said oscillator device comprises an analog ring oscillator, and said sampling component comprises a configuration of digital devices.

4. The system of claim 3, wherein:
said control unit is configured to control the timing of each of a succession of data sampling cycles, each of said cycles including one of said sample acquisition periods.

5. The system of claim 4, wherein:
said control unit generates a sample shift pulse following the sample acquisition period during each of said data sampling cycles.

6. The system of claim 5, wherein:
said sampling component comprises an incremental counter receiving the oscillator pulses generated during each of said sample acquisition periods, and further comprises a shift register receiving the count value of said counter following each of said sample acquisition periods, in response to one of said sample shift pulses.

7. The system of claim 6, wherein:
said shift register comprises a serial shifter; and
said ring oscillator, said incremental counter and said serial shift register are included in one of a plurality of substantially identical temperature sensitive sensor blocks that are selectively distributed within said integrated circuit.

8. The system of claim 7, wherein:
the serial shift registers of all of said sensor blocks are linked together along a single serial data path disposed to carry all of the count values respectively received by said serial shift registers to said control unit.

9. The system of claim 8, wherein:
said sensor blocks are arranged in a number of groups, and said system is provided with means for routing said serial path around a selected one of said sensor block groups.

10. The system of claim 9, wherein:
said threshold unit is adapted to compare received count values with stored threshold values, and to provide notice of warning and critical temperature levels for respective sensor blocks.

11. A method for monitoring temperature within a specified integrated circuit, said method comprising the steps of:
operating at least one oscillator device proximate to said integrated circuit to generate signal pulses at a frequency that varies as a function of the temperature adjacent to said oscillator device;
establishing sample acquisition periods of predetermined invariant time duration;
counting the number of pulses generated by said oscillator device during each of a succession of said time invariant sample acquisition periods; and
providing notice when at least some of said count values have a value associated with a prespecified excessive temperature level.

12. The method of claim 11, wherein:
a time invariant reference clock is used to establish the time duration for each of said sample acquisition periods.

13. The method of claim 12, wherein:
one of said sample acquisition periods is included in each of a succession of data sampling cycles, each of said cycles further including a sample shift pulse following its sample acquisition period.

14. The method of claim 13, wherein:
said oscillator device is included in one of a plurality of substantially identical temperature sensitive sensor blocks that are selectively distributed within said integrated circuit.

15. The method of claim 14, wherein:
all of said sensor blocks are linked together along a single serial data path disposed to carry all of the count values respectively provided by said sensor blocks to a control unit.

16. A computer program product in a computer readable medium for monitoring temperature within a specified integrated circuit, said computer program product comprising:
first instructions for operating at least one oscillator device proximate to said integrated circuit to generate signal pulses at a frequency that varies as a function of the temperature adjacent to said oscillator device;
second instructions for establishing sample acquisition periods of predetermined invariant time duration;
third instructions for counting the number of pulses generated by said oscillator device during each of a succession of said time invariant sample acquisition periods; and
fourth instructions for providing notice when at least some of said count values have a value associated with a prespecified excessive temperature level.

17. The computer program product of claim 16, wherein:
a time invariant reference clock is used to establish the time duration for each of said sample acquisition periods.

18. The computer program product of claim 17, wherein:
one of said sample acquisition periods is included in each of a succession of data sampling cycles, each of said cycles further including a sample shift pulse following its sample acquisition period.

19. The computer program product of claim 18, wherein:
said oscillator device is included in one of a plurality of substantially identical temperature sensitive sensor blocks that are selectively distributed within said integrated circuit.

20. The computer program product of claim 19, wherein:
all of said sensor blocks are linked together along a single serial data path disposed to carry all of the count values respectively provided by said sensor blocks to a control unit.

21. A system for monitoring temperature within a specified integrated circuit, said system comprising:
at least one oscillator device proximate to said integrated circuit for generating signal pulses at a frequency that varies as a function of the temperature adjacent to said oscillator device;
a control unit for establishing sample acquisition periods of predetermined invariant time duration;
a sampling component coupled to count the number of pulses generated by said oscillator device during each of a succession of said time invariant sample acquisition periods;
a threshold component responsive to the respective count values for said succession of sample acquisition periods to provide notice when at least some of said count values have a value associated with a prespecified excessive temperature level;
said control unit using a time invariant reference clock to establish the time duration for each of said sample acquisition periods; and said oscillator device including an analog ring oscillator, and said sampling component comprises a configuration of digital devices.

22. A method for monitoring temperature within a specified integrated circuit, said method comprising the steps of:
operating at least one oscillator device proximate to said integrated circuit to generate signal pulses at a frequency that varies as a function of the temperature adjacent to said oscillator device;
establishing sample acquisition periods of predetermined invariant time duration;
counting the number of pulses generated by said oscillator device during each of a succession of said time invariant sample acquisition periods;
providing notice when at least some of said count values have a value associated with a prespecified excessive temperature level;
a time invariant reference clock that is used to establish the time duration for each of said sample acquisition periods; and
one of said sample acquisition periods is included in each of a succession of data sampling cycles, each of said cycles further including a sample shift pulse following its sample acquisition period.

* * * * *